United States Patent
Dobner et al.

(10) Patent No.: US 12,288,830 B2
(45) Date of Patent: Apr. 29, 2025

(54) METHOD FOR SINGULATING COMPONENTS FROM A COMPONENT COMPOSITE, AND COMPONENT

(71) Applicant: OSRAM Opto Semiconductors GmbH, Regensburg (DE)

(72) Inventors: Andreas Dobner, Wenzenbach (DE); Matthias Goldbach, Pentling (DE); Georg Bogner, Lappersdorf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 478 days.

(21) Appl. No.: 17/633,081

(22) PCT Filed: Jul. 28, 2020

(86) PCT No.: PCT/EP2020/071253
§ 371 (c)(1),
(2) Date: Feb. 4, 2022

(87) PCT Pub. No.: WO2021/023577
PCT Pub. Date: Feb. 11, 2021

(65) Prior Publication Data
US 2022/0336697 A1    Oct. 20, 2022

(30) Foreign Application Priority Data
Aug. 8, 2019  (DE) .......................... 102019121449.1

(51) Int. Cl.
*H01L 33/00* (2010.01)
*H01L 31/02* (2006.01)
(Continued)

(52) U.S. Cl.
CPC .... *H01L 33/0095* (2013.01); *H01L 31/02005* (2013.01); *H01L 31/1848* (2013.01);
(Continued)

(58) Field of Classification Search
CPC .......... H01L 33/0095; H01L 31/02005; H01L 31/1848; H01L 31/186; H01L 21/78–786;
(Continued)

(56) References Cited

U.S. PATENT DOCUMENTS 7,790,195 B2  9/2010  Hardt et al.
9,698,282 B2  7/2017  Jaeger et al.
(Continued)

FOREIGN PATENT DOCUMENTS

CN   102473814 A   5/2012
CN   103681577 A   3/2014
(Continued)

*Primary Examiner* — Shahed Ahmed
(74) *Attorney, Agent, or Firm* — Slater Matsil, LLP

(57) ABSTRACT

In an embodiment a method for singulating components from a component composite includes providing the component composite comprising a structured substrate including component carrier bodies and connecting portions arranged between the component carrier bodies, and a base material, in which the connecting portions of the structured substrate are at least partially embedded, removing the base material in separating regions of the component composite, (Continued)

which include the connecting portions and singulating the component composite at the separating regions to form the components.

14 Claims, 3 Drawing Sheets

(51) Int. Cl.
  *H01L 31/18* (2006.01)
  *H01L 33/32* (2010.01)
  *H01L 33/62* (2010.01)
  *H01L 25/04* (2023.01)
  *H01L 25/075* (2006.01)
  *H01L 25/16* (2023.01)

(52) U.S. Cl.
  CPC ........ *H01L 31/186* (2013.01); *H01L 31/1876* (2013.01); *H01L 33/0075* (2013.01); *H01L 33/32* (2013.01); *H01L 33/62* (2013.01); *H01L 25/042* (2013.01); *H01L 25/0753* (2013.01); *H01L 25/167* (2013.01); *H01L 2933/0066* (2013.01)

(58) Field of Classification Search
  CPC ..... H01L 21/565–566; H01L 23/16–26; H01L 23/28–3192; H10K 71/851
  See application file for complete search history.

(56) References Cited

U.S. PATENT DOCUMENTS

| | | | |
|---|---|---|---|
| 9,985,171 | B2 | 5/2018 | Weidner et al. |
| 10,847,686 | B2 | 11/2020 | Brandl et al. |
| 2009/0166895 | A1* | 7/2009 | Noguchi ............. H05K 1/05 |
| | | | 29/846 |
| 2012/0119233 | A1 | 5/2012 | Weidner et al. |
| 2014/0084435 | A1 | 3/2014 | Kimura |
| 2014/0168988 | A1* | 6/2014 | Petersen .......... H01L 33/505 |
| | | | 362/293 |
| 2015/0333232 | A1 | 11/2015 | Preuß et al. |
| 2017/0077361 | A1 | 3/2017 | Brandl et al. |
| 2017/0141014 | A1* | 5/2017 | Cadag ........... H01L 23/49548 |

FOREIGN PATENT DOCUMENTS

| | | |
|---|---|---|
| CN | 106030832 A | 10/2016 |
| DE | 19641094 C1 | 6/1997 |
| DE | 19837764 C1 | 3/2000 |
| DE | 20013543 U1 | 11/2000 |
| DE | 10155139 A1 | 2/2003 |
| DE | 102008024704 A1 | 10/2009 |
| DE | 102009036621 A1 | 2/2011 |
| DE | 102014102810 A1 | 9/2015 |
| JP | 2002009195 A | 1/2002 |
| JP | 2003249616 A | 9/2003 |
| KR | 20130023432 A | 3/2013 |

* cited by examiner

METHOD FOR SINGULATING
COMPONENTS FROM A COMPONENT
COMPOSITE, AND COMPONENT

This patent application is a national phase filing under section 371 of PCT/EP2020/071253, filed Jul. 28, 2020, which claims the priority of German patent application 102019121449.1, filed Aug. 8, 2019, each of which is incorporated herein by reference in its entirety.

TECHNICAL FIELD

A method for singulating components from a component composite is specified. Preferably, the components are optoelectronic semiconductor components, such as radiation-emitting or radiation-detecting semiconductor components.

BACKGROUND

To achieve compact components, for example so-called QFN (Quad Flat No Leads) packages, in which the electrical connections formed from lead frame elements of a lead frame do not protrude beyond a plastic sheathing or a housing body, but are integrated flat into surfaces of the housing body, large-area substrates with a plastic sheathing can be used as starting components. A composite formed from the starting components must then be singulated to form individual components. A common method for this is singulation by sawing. However, this method is complex in several respects. On the one hand, it requires a sawing foil to support the process, which must be applied to the composite before sawing and removed after sawing. Secondly, a processing direction is dictated in most cases due to possible burr formation.

SUMMARY OF THE INVENTION

Embodiments provide a simpler method for singulating components from a component composite. Further embodiments provide a component that can be manufactured in a simpler manner.

According to at least one embodiment of a method for singulating components from a component composite, the method comprises the steps of:
  providing the component composite comprising a structured substrate,
  which comprises component carrier bodies and connecting portions arranged between the component carrier bodies,
  a base material, in which the connecting portions of the structured substrate are at least partially embedded,
  removing the base material in separating regions of the component composite, which include the connecting portions,
  singulating the component composite at the separating regions to form the components.

Preferably, the component carrier bodies are also at least partially embedded in the base material. Furthermore, it is possible that the separating regions also include portions of the base material in addition to the connecting portions.

By removing the base material in the separating regions, the component composite has a smaller thickness there, which facilitates the singulation of the component composite. Advantageously, this allows the use of less complex separation methods than previously used, for example punching methods, which otherwise require high forces.

Preferably, a separating region is assigned to each component carrier body or component, wherein the separation of the assigned separating region leads to an isolation of the component carrier body or component from the component composite. In particular, a respective separating region is arranged in a frame-like manner around a component carrier body or a component. In one possible embodiment the separating regions associated with the components are formed in a continuous manner, i.e. without transitions.

The structured substrate may be produced, for example, by structuring a raw material or starting material to form different functional areas, including the component carrier bodies and the connecting portions. During structuring, interstices may be formed in the starting material, resulting in a division of the starting material into the component carrier bodies and the connecting portions, with the component carrier bodies merging into the connecting portions and vice versa. For example, the connecting portions may be narrow connecting webs between the component carrier bodies. Further, the interstices may be perforations in the starting material.

In a preferred embodiment, a structured substrate is used in which the component carrier bodies are arranged in a regular pattern. A regular arrangement here refers to a recurring pattern of arrangement. For example, the component carrier bodies may be arranged in rows and columns. Preferably, two directly adjacent component carrier bodies are connected to each other by at least one connecting portion. In particular, the component carrier bodies have an at least approximately rectangular, for example square, shape. Other geometric shapes of the component carrier bodies, in particular triangular, hexagonal or circular structures, are also suitable in the present case.

In a preferred embodiment, the components that are singulated from the component composite are optoelectronic semiconductor components and each comprise a component carrier body and at least one optoelectronic semiconductor chip arranged on the component carrier body. Advantageously, the component carrier body comprises at least one chip mounting portion for mounting the semiconductor chip and at least one terminal portion to which the semiconductor chip is electrically conductively connected.

The semiconductor chip may be a radiation-emitting semiconductor chip, for example a light-emitting diode chip or laser diode chip, or a radiation-detecting semiconductor chip, for example a photodiode or phototransistor. In particular, the radiation-emitting semiconductor chip is suitable for emitting electromagnetic radiation in the visible, ultraviolet or infrared spectral range. Furthermore, the radiation-detecting semiconductor chip is preferably suitable for detecting electromagnetic radiation in the visible, ultraviolet or infrared spectral range. Furthermore, the semiconductor chip may be provided for detecting chemicals, such as gases. The radiation-emitting or radiation-detecting semiconductor chip may comprise a semiconductor body having an active zone suitable for radiation generation or radiation detection. In particular, the active zone is a p-n junction zone. In this regard, the active zone may be formed as a single layer or as a layer sequence of a plurality of layers.

For each of the layers of the semiconductor body, materials based on nitride or phosphide compound semiconductors are preferably considered. "Based on nitride compound semiconductors" in the present context means that at least one layer of the semiconductor body comprises a nitride III/V compound semiconductor material, preferably $Al_n Ga_m In_{1-n-m} N$, with $0 \leq n \leq 1$, $0 \leq m \leq 1$ and $n+m \leq 1$. Accordingly, "based on phosphide compound semiconductors" means that at least one layer of the semiconductor body comprises $Al_nGa_mIn_{1-n-m}P$, with $0 \leq n \leq 1$, $0 \leq m \leq 1$ and $n+m \leq 1$. This material need not necessarily have a mathematically exact composition according to the above formula. Rather, it may comprise one or more dopants as well as additional constituents that do not substantially alter the characteristic physical properties of the $Al_nGa_mIn_{1-n-m}N$ or $Al_nGa_mIn_{1-n-m}P$ material. For the sake of simplicity, however, the above formula includes only the essential constituents of the crystal lattice (Al, Ga, In, N), even if these may be partially replaced by small amounts of additional substances.

Furthermore, the connecting portions are in particular substrate regions of reduced thickness. In contrast, the component carrier bodies comprise substrate regions of maximum thickness, i.e. regions in which the substrate has in particular its initial thickness. Preferably, the substrate has a maximum thickness or vertical extent of between 100 µm and 300 µm inclusive, with deviations of ±10% being within the tolerance range. Preferably, on a front side of the substrate, the component carrier bodies protrude beyond the connecting portions in the vertical direction at least in places. Also on a rear side of the substrate, the component carrier bodies can protrude beyond the connection portions in the vertical direction at least in places or can be flush with them.

In particular, in the context of the present application, the rear side designates a side intended for subsequent assembly of the finished components, whereas the front side is a side opposite the rear side, for example intended for emission of radiation.

Preferably, the connecting portions are completely covered by the base material on the front side of the substrate. On the rear side, the connecting portions can be completely covered by the base material, in particular if a flush fitting with the component carrier bodies is to be achieved.

According to at least one embodiment, the base material is removed in the separating regions by means of a photostructured coating.

In this case, a photosensitive coating is first applied to the component composite and the photostructured coating is produced by means of a lithographic process, the photosensitive coating being removed in the separating regions of the component composite. Solvents such as propylene glycol monomethyl ether acetate (PGMEA), acetone, N-methyl-2-pyrrolidone (NMP), and dimethyl sulfoxide (DMSO) may be used to remove the photosensitive coating, particularly if the photosensitive coating is a photoresist. If the photosensitive coating contains or consists of an epoxy, the solvent used is preferably acetone or a substance known as "Dynasolve". The photosensitive coating may be applied to a front and/or rear side of the component composite.

Preferably, the photosensitive coating applied to the component composite is a photoresist, and both positive and negative photoresists may be used for the photosensitive coating. By exposing the photosensitive coating to a suitable mask, areas are defined, on the one hand, which are removed in a subsequent stripping process and, on the other hand, areas are defined which remain on the component composite during the stripping process. During this process, the photostructured coating is formed, which has interruptions in the separating regions of the component composite.

In at least one embodiment of the method, the singulation of the component composite is affected by means of punching. Compared to sawing, punching can be carried out much faster and is therefore particularly advantageous if a plurality of components are to be singulated from a component composite. Moreover, no additional foil is required to be applied and removed again to support the process. In particular, the component carrier bodies are punched out of the substrate or the components are punched out of the composite. For this purpose, it is advantageous if the separating regions which are cut through during punching follow a contour of the component carrier bodies or components, so that the component carrier bodies or components are detached from the component composite as a whole during punching. Preferably, several component carrier bodies or components are punched out simultaneously.

In one possible configuration of the method, a punching tool comprising at least one punch and a die is used for punching. The at least one punch may have a punching crown for improved punching. This is formed in particular in the shape of a frame with a preferably flat end face, which has an edge which serves as a cutting edge during punching. The punch or the punching crown has in particular a cross-sectional shape corresponding to the component carrier body or component, which is preferably at least approximately rectangular, in particular square, triangular, hexagonal or circular. Advantageously, more complex geometric shapes of the component carrier bodies are possible during punching compared to sawing. Furthermore, the punch or the punching crown preferably has a contour which corresponds in shape and size to the separating regions.

The singulation or punching process may be performed starting from a rear side of the component composite ("upside-down"), i.e. from the side of the substrate. Alternatively, the component composite may be singulated or punched starting from a front side of the component composite ("upside-up"), i.e. from the side on which the base material is arranged. In contrast to a conventional sawing process, the processing direction can thus advantageously be freely selected.

In an advantageous embodiment of the method, the connecting portions are at least partially exposed when the base material is removed. In particular, the base material is removed up to a surface of each connecting portion arranged on the front side of the substrate. Preferably, the surface is thereby largely exposed.

Removing the base material may create at least one depression in the base material at the connecting portions. In particular, the depression is located on the front side of the composite. Preferably, the photostructured coating is completely removed from the component composite after creating the at least one depression.

Advantageously, the depression has a lateral extent corresponding to the thickness of the starting material of the substrate. Such a lateral extent ensures sufficient stability during singulation of the component composite.

Preferably, the connecting portions arranged in a common separating region are exposed by a single depression. In other words, the depressions arranged at the connecting portions of a common separating region are formed contiguously, so that only one depression exists. This depression may be arranged in a frame-like manner around the respective component carrier body or the respective component. In addition, all the separating regions may be formed contiguously and have a common, for example grid-shaped, depression.

In an advantageous embodiment, side walls of the depression formed from the base material and laterally delimiting the depression form at least parts of side walls of the components after singulation. In the finished component, the base material can thereby form an edge portion laterally surrounding the semiconductor chip. In the finished component, the base material may form not only a part of the side walls, but also a part of a component carrier comprising the component carrier body and the base material. Here, the base material may be disposed in interstices of the component carrier body.

A plastic material is particularly suitable for the base material. For example, silicones or epoxy resins can be used as a base material. Radiation-absorbing and/or reflecting additional materials may be incorporated into the base material. Furthermore, the base material may be a photosensitive or photostructurable material. In this case, the base material can be directly structured without using an additional photosensitive layer.

According to an advantageous embodiment, the base material is applied to the substrate using an injection molding process. Furthermore, the base material may be applied to the substrate by means of an additive manufacturing process. In particular, stereolithographic processes or melting processes are suitable.

Further, the substrate comprises a base body which preferably contains or consists of one of the following materials: metal, plastic, glass, ceramic. For example, the substrate may be a lead frame, that is, a structured metal body. Furthermore, the substrate may be a foil or a glass or ceramic substrate with metallizations.

According to at least one embodiment of a component, the component comprises a component carrier body and at least one semiconductor chip arranged on the component carrier body. Furthermore, the component comprises a base material, which is arranged circumferentially downstream of the semiconductor chip and partially bounds the component outwardly at side surfaces, wherein the component has singulation traces on the side surfaces. Preferably, the singulation traces are traces caused by punching. These have a horizontal structure, while traces caused by sawing have a vertical structure. The structure of the singulation traces thus contains an indication of the singulation process.

Preferably, the component is a so-called "QFN package", so that the component carrier body is flush with the housing material at the side surfaces. At a front side of the component, the housing material may also be flush with the component carrier body or may extend vertically beyond the component carrier body. In the latter case, the housing material particularly encloses a cavity in which, for example, a potting can be arranged to encapsulate the at least one semiconductor chip. Alternatively, the at least one semiconductor chip may be embedded in the base material.

As mentioned above, the component carrier body may include at least one chip mounting portion for mounting the semiconductor chip and at least one terminal portion to which the semiconductor chip is electrically connected. The semiconductor chip may be connected to the terminal portion by means of an electrical connection means, such as a planar conductor (so-called "planar interconnect") or a bonding wire. Further, the chip mounting portion may be provided as another terminal portion to which the semiconductor chip is electrically conductively attached.

In a preferred embodiment, main surfaces of the component arranged on the front and rear sides are planar. In particular, the terminal and chip mounting portions are uncovered by the base material on the underside main surface of the component. Thus, the component can be electrically connected on the underside and is thus surface mountable.

The method described above is particularly suitable for the manufacture of a plurality of the components described herein. Features described in connection with the component can therefore also be used for the method and vice versa.

The component is particularly suitable for automotive and multimedia applications, such as dashboard or video wall applications, as well as for general lighting.

BRIEF DESCRIPTION OF THE DRAWINGS

Further advantages, advantageous embodiments and further developments will become apparent from the exemplary embodiments described below in connection with the figures.

DETAILED DESCRIPTION OF ILLUSTRATIVE EMBODIMENTS

In the exemplary embodiments and figures, identical elements, elements of the same kind or elements having the same effect may each be provided with the same reference signs. The elements shown and their size ratios to one another are not necessarily to be regarded as true to scale; rather, individual elements may be shown exaggeratedly large for better representability and/or for better understanding.

Figure 1:
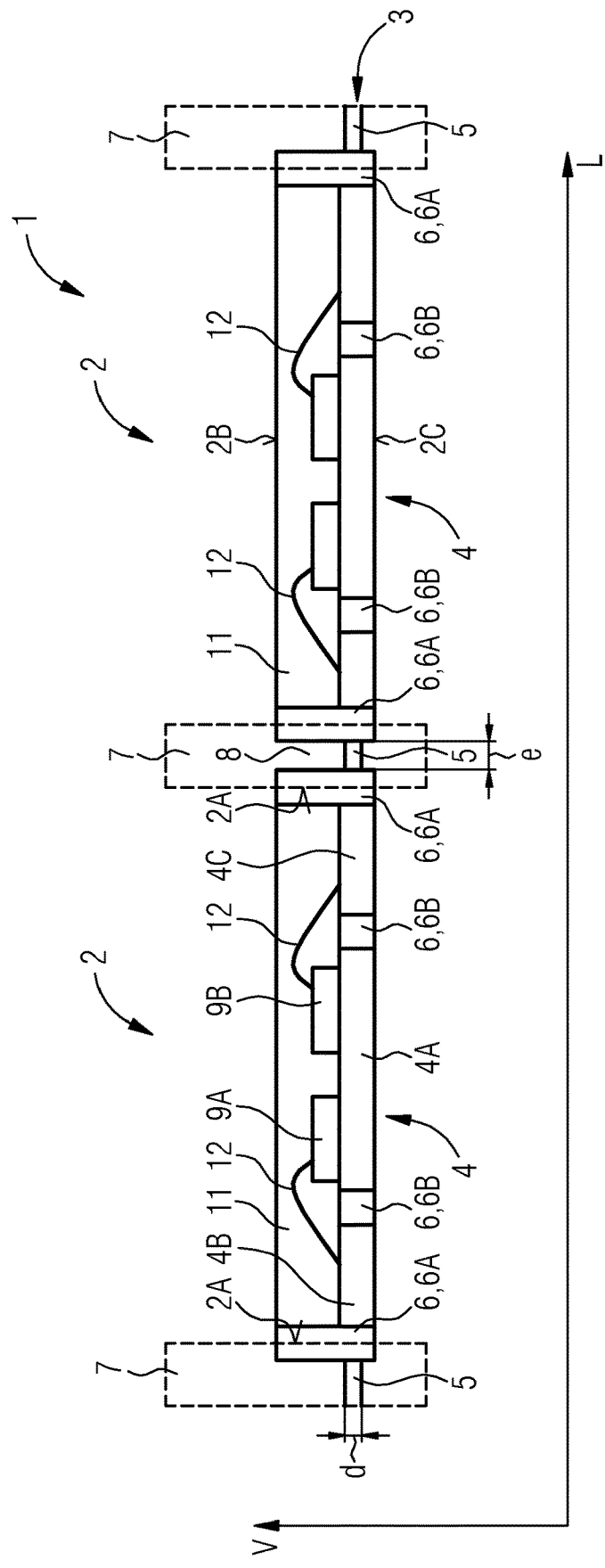
FIG. 1 shows a schematic cross-sectional view of a component composite or an intermediate stage of a method for singulating components according to a first exemplary embodiment.

In the first exemplary embodiment of a component composite 1 or intermediate stage of a method for singulating components 2 shown in FIG. 1, the component composite 1 comprises a structured substrate 3, which comprises component carrier bodies 4 and connecting portions 5 arranged between the component carrier bodies 4. Furthermore, the component composite 1 comprises a base material 6, 6A, in which the connecting portions 5 of the structured substrate 3 are at least partially embedded. The component carrier bodies 4 are each intended for forming a supporting or mechanically stabilizing element of a component carrier in the finished components 2. The base material 6, 6A arranged in each case between two adjacent component carrier bodies 4 can be part of a housing in the finished component 2 and can have a mechanical protective function. The connecting portions 5 provide a mechanical connection between the component carrier bodies 4 in the composite.

As a whole, the substrate 3 is structured into different functional areas compared to a raw material or unprocessed starting material. In this respect, the component carrier bodies 4 may be separated from each other by interstices. Likewise, the connecting portions 5 may also be separated from each other by interstices. For example, the connecting portions 5 may be narrow connecting webs between the component carrier bodies 4. Furthermore, the interstices may be perforations, i.e. through-holes, in the starting material.

In the exemplary embodiment shown in FIG. 1, the structured substrate 3 is a lead frame, i.e. a structured metal body. Alternatively, the structured substrate 3 may comprise a base body of, for example, plastic, glass or ceramic and be provided with metallizations.

Furthermore, the structured substrate 3 may comprise regions of different thickness d, i.e. regions with a different extent in the vertical direction V. In this context, the connecting portions 5 are in particular substrate regions of reduced thickness d. In contrast, the component carrier bodies 4 comprise substrate regions of maximum thickness d, i.e. regions in which the substrate 3 has in particular its initial thickness. In particular, in the first exemplary embodiment, the component carrier bodies 4 are planar, which means that they have flat main surfaces on their front and rear sides. The substrate 3 preferably has a maximum thickness d or vertical extent of between 100 µm and 300 µm inclusive, with deviations of ±10% being within the tolerance range. The thickness d of the connecting portions 5 is preferably between one third and 100% inclusive of the initial thickness of the substrate 3. Furthermore, the vertical extent d of the component composite 1 or of the individual components 2 is preferably between 200 µm and 700 µm inclusive, deviations of ±10% being within the tolerance range.

The reduced thickness d of the connecting portions 5 facilitates a separation of the component composite 1 at the connecting portions 5.

The component carrier bodies 4 may protrude beyond the connecting portions 5 in the vertical direction V on both a front side and a rear side of the substrate 3, so that a step is formed in a cross-section on the front side and rear side at the transition between a respective component carrier body 4 and a connecting portion 5. Among other things, this provides better adhesion of the base material 6, 6A to the component carrier body 4.

A plastic material is particularly suitable for the base material 6. For example, silicones or epoxy resins are suitable as base material 6. Radiation-absorbing and/or reflecting additional materials may be incorporated into the base material 6. Furthermore, the base material 6 may be a photosensitive material, in which case the base material 6 may be directly structured without using an additional photosensitive layer. For example, the base material 6 may be applied to the substrate 3 by means of an injection molding process or an additive manufacturing process such as a stereolithographic process or melting process, wherein the component carrier bodies 4 are embedded in the base material 6. By structuring the base material 6, cavities 11 can then be created on the front side of the component composite 1, each of which is bounded laterally by the base material 6A and on the underside by the component carrier body 4 and further base material 6B. The cavities 11 are provided for receiving semiconductor chips 9A, 9B, 9C.

In the structured substrate 3, the component carrier bodies 4 are regularly arranged in rows A and columns B (cf. FIG. 2), with the connecting portions 5 being arranged between the rows A and columns B in each case. In particular, the component carrier bodies 4 have an at least approximately rectangular, for example square, shape in plan view of the front side of the component composite 1, although other shapes, such as triangular, hexagonal or circular structures, are also possible.

Figure 2:
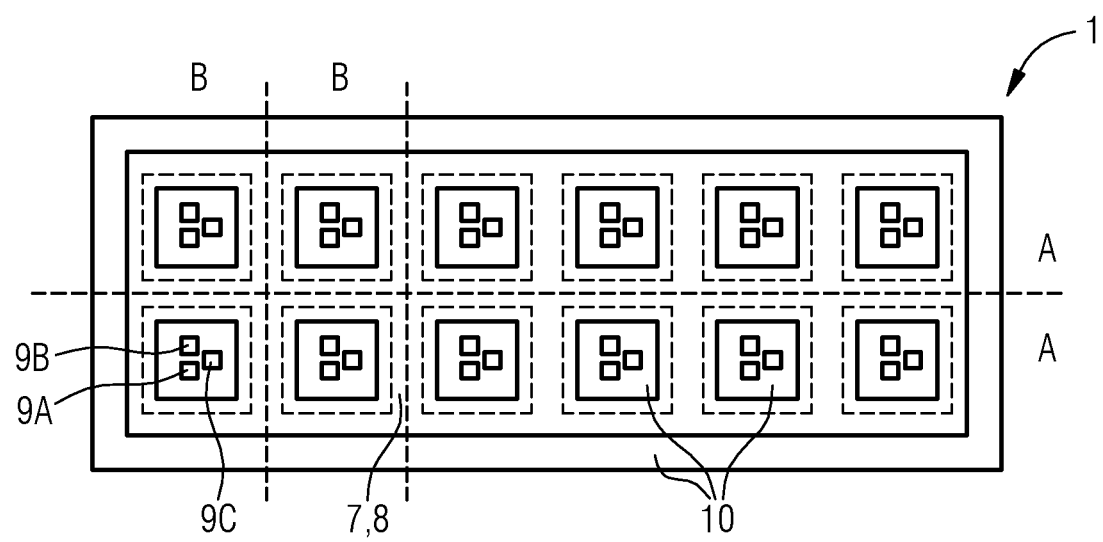
FIG. 2 shows a schematic top view of a component composite or an intermediate stage of a method for singulating components according to a second exemplary embodiment.

The components 2 which are singulated from the component composite 1 are in particular optoelectronic semiconductor components which each comprise a component carrier body 4 and one or more optoelectronic semiconductor chips 9A, 9B, 9C arranged on the component carrier body 4 (cf. also FIG. 2). In this case, the component carrier body 4 comprises at least one chip mounting portion 4A for mounting the semiconductor chips 9A, 9B, 9C and one or more terminal portions 4B, 4C for supplying electricity to the semiconductor chips 9A, 9B, 9C.

The semiconductor chips 9A, 9B, 9C are radiation-emitting or radiation-detecting semiconductor chips each comprising a semiconductor body having an active zone capable of generating radiation or detecting radiation. In particular, the active zone is a p-n junction zone. In this regard, the active zone may be formed as one layer or as a layer sequence of a plurality of layers. For example, the active zone emits or detects electromagnetic radiation, such as in the visible, ultraviolet or infrared spectral range, during operation of the component 2, respectively. For example, the components 2 may be configured to emit white light during operation. This may be realized by the semiconductor chips 9A, 9B, 9C emitting different colored light, such as blue light (for example semiconductor chip 9A), red light (for example semiconductor chip 9B) and green light (for example semiconductor chip 9C) during operation. For the layers of the semiconductor bodies, as mentioned above, materials based on nitride or phosphide compound semiconductors are preferably considered in each case.

According to the first exemplary embodiment, the method for singulating the components 2 from the component composite 1 comprises the steps of:

a) providing the component composite 1 comprising the structured substrate 3 and the base material 6, in which the connecting portions 5 are embedded, b) removing the base material 6 in separating regions 7 of the component composite 1, which include the connecting portions 5, c) singulating the component composite 1 at the separating regions 7 to form the components 2.

Here, a separating region 7 is assigned to each component carrier body 4 or component 2, wherein the separation of the assigned separating region 7 leads to an isolation of the component carrier body 4 or component 2 from the component composite 1. In particular, a respective separating region 7 is arranged in a frame-like manner around a component carrier body 4 or a component 2. In addition to the connecting portions 5, the separating regions 7 include portions of the base material 6.

The intermediate stage of the method shown in FIG. 1 is reached after carrying out method steps a) to b) and before carrying out method step c).

Before carrying out method step b), the connecting portions 5 are covered by the base material 6 on the front and rear sides as well as on their lateral sides.

In method step b), the base material 6 is removed in the separating regions 7 by means of a photostructured coating.

In this case, a photosensitive coating 10 is first applied to the component composite 1 and is suitably structured by means of a lithographic process, wherein portions of the coating 10 lying in the separating regions 7, in particular portions arranged at the connecting portions 5, are removed. The photosensitive coating 10 may be applied to a front and/or rear side of the component composite 1, in particular to exposed regions of the base material. For example, the photosensitive coating is a photoresist, and both positive and negative coatings may be used for the photosensitive coating 10. Exposure of the photosensitive coating 10 with a suitable mask defines, on the one hand, areas which are removed in a subsequent stripping process and, on the other hand, areas which remain on the component composite 1 during the stripping process. The photostructured coating 10 consists of the areas remaining on the component composite 1.

By removing the base material 6 in the separating regions 7, the connecting portions 5 are exposed on the front and rear sides and, if applicable, on the lateral sides. In particular, the base material 6 is removed in each case up to a surface of each connecting portion 5 arranged on the front and rear sides of the substrate 3. Preferably, the respective surface is thereby largely exposed.

By removing the base material 6, at least one depression 8 is created in the base material 6 at the connecting portions 5. Advantageously, the depression 8 has a lateral extent e corresponding to the thickness d of the starting material of the substrate 3. The lateral extent e is determined parallel to a lateral direction L, which is arranged perpendicular to the vertical direction V and parallel to a main extension plane of the component composite 1. Advantageously, the connecting portions 5 arranged in a common separating region 7 are exposed by a single depression 8 which is arranged in particular in a frame-like manner around the associated component carrier body 4 or the associated component 2. In addition, all the separating regions 7 may be formed contiguously and have a common grid-shaped depression 8 (cf. FIG. 2).

Side walls of the depression 8 formed from the base material 6, 6A and laterally delimiting the depression 8 form side walls of the components 2 after singulation. In the finished component 2, the base material 6 may form an edge portion laterally surrounding the semiconductor chips 9A, 9B, 9C.

By removing the base material 6 in the separating regions 7, the component composite 1 advantageously has a smaller thickness there, which facilitates the singulation of the component composite 1.

In method step c), the component composite 1 is advantageously singulated into the components 2 by means of punching. In this process, the component carrier bodies 4 are punched out of the substrate 3 and the components 2 are punched out of the composite 1.

A punching tool may be used for punching, comprising at least one punch and a die (not shown). The at least one punch may have a punching crown for improved punching. This is formed in particular in the shape of a frame with a preferably flat end face, which has an edge which serves as a cutting edge during punching. The punching crown or a shaping recess of the die has in particular a cross-sectional shape corresponding to the component carrier body 4 or component 2, which is preferably at least approximately rectangular, in particular square, triangular, hexagonal or circular. Furthermore, the punching crown or shaping recess of the die preferably has a contour which corresponds in shape and size to the separating regions 7. In particular, the separating regions 7 have an at least approximately rectangular, for example square, or else triangular, hexagonal or circular shape when viewed from above the front side of the component composite 1.

The singulation or punching process may be performed starting from a rear side of the component composite 1 ("upside-down"), i.e. from the side of the substrate 3. Alternatively, the component composite 1 may be singulated or punched starting from a front side of the component composite 1 ("upside-up"), i.e. from the side on which the base material 6 is arranged. In contrast to a conventional sawing process, on the one hand the processing direction can be freely selected and on the other hand an additional foil can be dispensed with.

A component 2 singulated by means of the method according to the first exemplary embodiment comprises, as shown in FIG. 1, a component carrier body 4 and a plurality of semiconductor chips 9A, 9B, 9C arranged on the component carrier body 4. Furthermore, the component 2 comprises a base material 6A which is arranged circumferentially downstream of the semiconductor chips 9A, 9B, 9C and partially bounds the component 2 outwardly at side surfaces 2A, the component 2 having singulation traces at the side surfaces 2A. In particular, these are singulation traces caused by punching. They have a horizontal structure, while traces caused by sawing have a vertical structure.

The component 2 is a "QFN package", so that the component carrier body 4 is flush with the housing material 6A at the side surfaces 2A. On the front side of the component 2, the housing material 6A extends beyond the component carrier body 4 in the vertical direction V. The housing material 6A encloses a cavity 11 in which the semiconductor chips 9A, 9B, 9C and a potting encapsulating the semiconductor chips 9A, 9B, 9C are arranged. The potting is preferably flush with the housing material 6A on the front side of the component 2. The potting is in particular a radiation-transmissive plastic material.

The component carrier body 4 comprises a common chip mounting portion 4A for mounting the semiconductor chips 9A, 9B, 9C, wherein the chip mounting portion 4A also serves as a terminal portion of a first polarity. Furthermore, the component carrier body 4 comprises further terminal portions 4B, 4C of a second polarity, wherein one of the semiconductor chips 9A, 9B, 9C is connected in each case to a terminal portion of a second polarity. The semiconductor chips 9A, 9B, 9C are connected to the respective terminal portion 4B, 4C by means of an electrical connection means 12, namely by means of a bonding wire.

Main surfaces 2B, 2C of the component 2 arranged on the front and rear sides are planar. Furthermore, the terminal and chip mounting portions 4A, 4B, 4C on the underside main surface 2C of the component 2 are uncovered by the base material 6. Thus, the component 2 can be electrically connected on the underside and is thus surface mountable.

Figure 3:
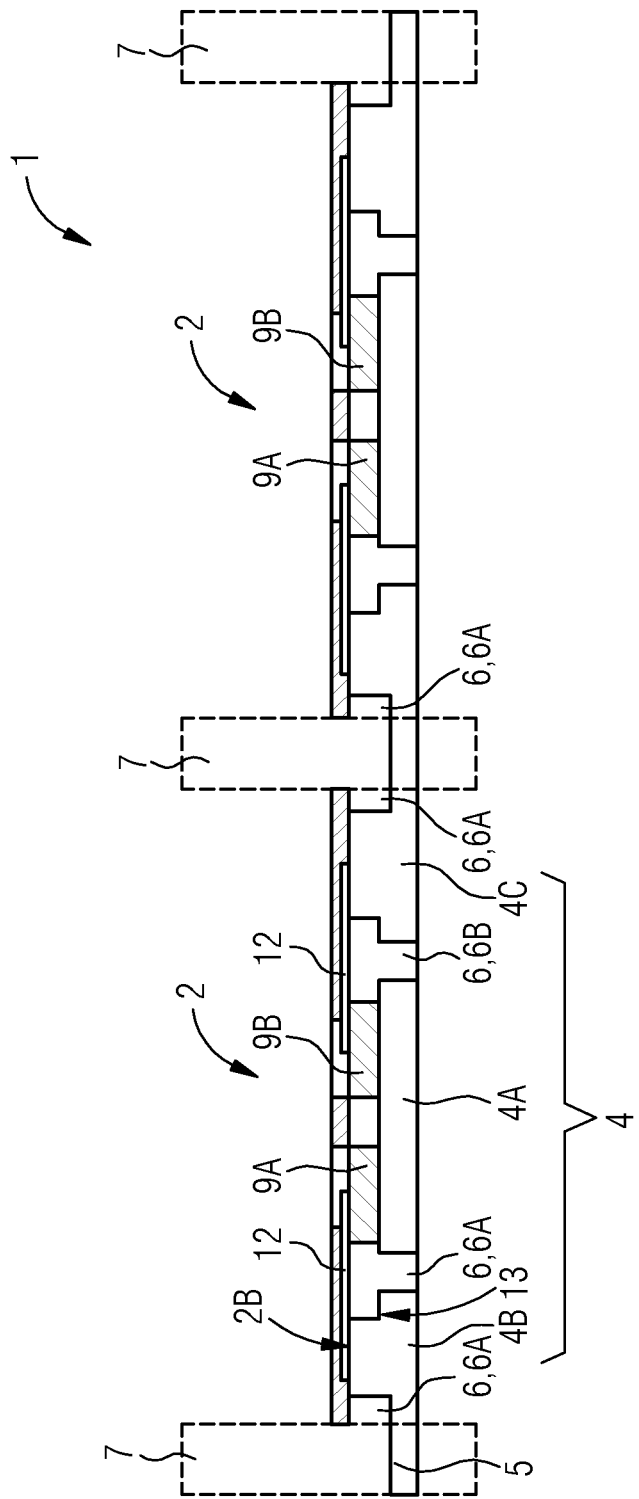
FIG. 3 shows a schematic cross-sectional view of a section of the component composite or an intermediate stage of the method for singulating components according to the second exemplary embodiment.

In the second exemplary embodiment of a component composite 1 or intermediate stage of a method for singulating components 2 shown in FIGS. 2 and 3, the component carrier bodies 4 have an uneven front main surface 2B, in contrast to the first exemplary embodiment. A further difference is the type of contacting. In the second exemplary embodiment, the connection means 12 are planar conductors (so-called "planar interconnects") each extending in an uncurved manner from the semiconductor chips 9A, 9B, 9C to the associated terminal portions 4B, 4C of the second polarity. This is made possible by the semiconductor chips 9A, 9B, 9C being arranged in a recess 13 of the component carrier body 4, the semiconductor chips 9A, 9B, 9C being flush with the component carrier bodies 4 on the front side, respectively. Preferably, the semiconductor chips 9A, 9B, 9C are embedded in the housing material 6, 6B that fills the recesses 13.

For the further features of the component composite 1, the method for singulating and the singulated components 2, reference is made to the explanations given in connection with the first exemplary embodiment.

The invention is not limited by the description based on the exemplary embodiments. Rather, the invention encompasses any new feature as well as any combination of features, which in particular includes any combination of features in the patent claims, even if this feature or combination itself is not explicitly stated in the patent claims or embodiments.

The invention claimed is:

1. A method for singulating components from a component composite, the method comprising:
   providing the component composite comprising a structured substrate including component carrier bodies and connecting portions arranged between the component carrier bodies, and a base material, in which the connecting portions of the structured substrate are at least partially embedded;
   removing the base material in separating regions of the component composite, which include the connecting portions; and
   singulating the component composite at the separating regions to form the components.

2. The method according to claim 1, wherein singulating comprises punching.

3. The method according to claim 1, wherein the component carrier bodies are punched out of the substrate.

4. The method according to claim 1, wherein the connecting portions are at least partially exposed when the base material is removed.

5. The method according to claim 1, wherein at least one depression is created in the base material at the connecting portions by removing the base material.

6. The method according to claim 5, wherein the depression has a lateral extent corresponding to a thickness of a starting material of the substrate.

7. The method according to claim 5, wherein side walls of the depression formed from the base material and laterally delimiting the depression form at least parts of side walls of the components after singulating.

8. The method according to claim 1, wherein the base material is removed in the separating regions by a photostructured coating.

9. The method according to claim 8, wherein a photosensitive coating is applied to the component composite and the photostructured coating is produced by a lithographic process, and wherein the photosensitive coating is removed in the separating regions of the component composite.

10. The method according to claim 1, wherein the connecting portions are substrate regions of reduced thickness and the component carrier bodies comprise substrate regions of maximum thickness.

11. The method according to claim 1, wherein the components are optoelectronic semiconductor components, and wherein each component comprises a component carrier body and at least one optoelectronic semiconductor chip arranged on the component carrier body.

12. The method according to claim 1, wherein the base material comprises a plastic material.

13. The method according to claim 1, wherein the substrate comprises a base body containing or consisting of metal, plastic, glass or ceramic.

14. A method for singulating components from a component composite, the method comprising:
   providing the component composite comprising a structured substrate including component carrier bodies and connecting portions arranged between the component carrier bodies, and a base material, in which the connecting portions of the structured substrate are at least partially embedded;
   removing the base material in separating regions of the component composite, which include the connecting portions; and
   singulating the component composite at the separating regions to form the components,
   wherein the base material is a photosensitive material.

* * * * *